(12) United States Patent
Lai et al.

(10) Patent No.: US 7,745,893 B2
(45) Date of Patent: Jun. 29, 2010

(54) MAGNETIC TRANSISTOR STRUCTURE

(75) Inventors: James Chyi Lai, St. Paul, MN (US); Tom Allen Agan, St. Paul, MN (US)

(73) Assignee: Northern Lights Semiconductor Corp., St. Paul, MI (US)

( * ) Notice: Subject to any disclaimer, the term of this patent is extended or adjusted under 35 U.S.C. 154(b) by 935 days.

(21) Appl. No.: 11/539,284

(22) Filed: Oct. 6, 2006

(65) Prior Publication Data

US 2007/0152254 A1 Jul. 5, 2007

Related U.S. Application Data

(60) Provisional application No. 60/727,348, filed on Oct. 17, 2005, provisional application No. 60/727,345, filed on Oct. 17, 2005.

(51) Int. Cl.
H01L 29/78 (2006.01)
(52) U.S. Cl. ............... 257/421; 257/422; 257/423; 257/424; 257/425; 257/426; 257/427; 257/E29.323; 257/E29.167; 257/E43.004; 257/E27.006
(58) Field of Classification Search ......... 257/421–427, 257/295, E29.323, E29.167, E43.004, E27.006, 257/20, 414; 438/3; 360/324–326, 313; 365/157, 158, 171–173; 29/737
See application file for complete search history.

(56) References Cited

U.S. PATENT DOCUMENTS

| 5,432,373 | A | 7/1995 | Johnson |
| 5,783,460 | A * | 7/1998 | Han et al. ............ 438/3 |
| 6,104,275 | A | 8/2000 | Maeda |
| 6,278,593 | B1 | 8/2001 | Nakatani et al. |
| 2006/0139817 | A1 | 6/2006 | Inomata et al. |
| 2007/0086233 | A1 | 4/2007 | Lai et al. |
| 2007/0152254 | A1 | 7/2007 | Lai et al. |
| 2007/0164382 | A1 | 7/2007 | Lai et al. |

FOREIGN PATENT DOCUMENTS

DE  696 09 165  3/2001

(Continued)

OTHER PUBLICATIONS

Machine translation of JP08-329426, foreign document cited previously by applicant.*

(Continued)

*Primary Examiner*—Matthew C Landau
*Assistant Examiner*—Jessica Hall
(74) *Attorney, Agent, or Firm*—Thomas, Kayden, Horstemeyer & Risley

(57) ABSTRACT

A magnetic transistor includes a first magnetic section, a second magnetic section, a conductive section, a first metal terminal, and a second metal terminal. The conductive section is disposed between and is in direct contact with both the first and second magnetic section. The first metal terminal is disposed on one end of an opposite surface to the conductive section of the first magnetic section. The second metal terminal is disposed on one end approximately diagonal to the first metal terminal on an opposite surface to the conductive section of the second magnetic section. While the magnetic transistor structure is turned on, a current flows through the first magnetic section and the second magnetic section via the conductive section.

17 Claims, 4 Drawing Sheets

FOREIGN PATENT DOCUMENTS

| | | |
|---|---|---|
| DE | 101 44 385 | 3/2003 |
| DE | 102 20 911 | 12/2003 |
| EP | 0 959 475 | 11/1999 |
| EP | 1 349 184 | 10/2003 |
| JP | 8-329426 | 12/1996 |

OTHER PUBLICATIONS

English language translation of abstract of JP 8-329426.
English language translation of abstract of DE 101 44 385.
English language translation of abstract of DE 696 09 165.
English language translation of abstract of DE 102 20 911.

* cited by examiner

MAGNETIC TRANSISTOR STRUCTURE

CROSS-REFERENCE TO RELATED APPLICATION

This application claims the priority benefit of U.S. Provisional Application Ser. No. 60/727,348, filed Oct. 17, 2005 and U.S. provisional Application No. 60/727,345, filed Oct. 17, 2005, the full disclosures of which are incorporated herein by reference.

BACKGROUND

1. Field of Invention

The present invention relates to a transistor. More particularly, the present invention relates to a structure of magnetic transistor.

2. Description of Related Art

The Giant Magnetoresistance Effect (GMR) is a quantum mechanical effect observed in structures with alternating thin magnetic and thin nonmagnetic sections. The GMR effect shows a significant change in electrical resistance from the zero-field high resistance state to the high-field low resistance state according to an applied external field.

FIG. 1 is a structure diagram depicting a conventional magnetic transistor 100 of the prior art. The conductive section 106 is disposed on the second magnetic section 104, and the first magnetic section 102 is disposed on the conductive section 106. The first metal 108 is adjacent to and completely covers one side of the first magnetic section 102, the conductive section 106, and the second magnetic section 104. The second metal 110 is adjacent to and completely covers the other side of the first magnetic section 102, the conductive section 106, and the second magnetic section 104.

Operation of the conventional 2-terminal magnetic transistor 100 is explained as follows. The operation of the magnetic transistor 100, for example, is according to an external applied field (for example, using the third metal 112 and the fourth metal 114 to control the direction of the dipoles of the first magnetic section 102 and the second magnetic section 104). When the conventional 2-terminal magnetic transistor 100 is turned on, a current is generated and flows in the direction of the first metal and the second metal. The current may avoid crossing any magnetic boundary (for example, a boundary between the first magnetic section 102 and the conductive section 106, or a boundary between the conductive section 106 and the second magnetic section 104, or both boundaries), and only a small percentage of the current actually passes through both boundaries resulting in only a few percent resistance changed which means a smaller GMR effect. Further, the conventional 2-terminal magnetic transistor 100 has only two output terminals, the current can only either be outputted from the first metal 108 or the second metal 110.

For the foregoing reasons, there is a need to have a magnetic transistor possess the larger GMR effect with a multi-terminal outputted capability.

SUMMARY

According to one embodiment of the present Invention, a magnetic transistor includes a first magnetic section, a second magnetic section, a conductive section, a first metal terminal, and a second metal terminal. The conductive section is disposed between and is in direct contact with both the first and second magnetic section. The first metal terminal is disposed on one end of an opposite surface to the conductive section of the first magnetic section. The second metal terminal is disposed on one end approximately diagonal to the first metal terminal on an opposite surface to the conductive section of the second magnetic section. While the magnetic transistor structure is turned on, a current flows through the first magnetic section and the second magnetic section via the conductive section.

According to another embodiment of the present invention, a magnetic transistor includes a first magnetic section, a second magnetic section, a conductive section, a first metal terminal, a second metal terminal, a third metal terminal, and a fourth metal terminal. The conductive section is disposed between and is in direct contact with both the first and second magnetic section. The first magnetic section, the conductive section, and the second magnetic section are about the same length. The first metal terminal is disposed on one end of an opposite surface to the conductive section of the first magnetic section. The second metal terminal is disposed on one end approximately diagonal to the first metal terminal on an opposite surface to the conductive section of the second magnetic section. The third metal terminal is disposed on the other end of the opposite surface to the conductive section of the first magnetic section. The fourth metal terminal is disposed on the other end approximately diagonal to the third metal terminal on the opposite surface to the conductive section of the second magnetic section. A current is outputted from either the first metal terminal, the second metal terminal, the third metal terminal or the fourth metal terminal by flowing through the first magnetic section and the second magnetic section via the conductive section while the magnetic transistor is turned on.

It is to be understood that both the foregoing general description and the following detailed description are by examples, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
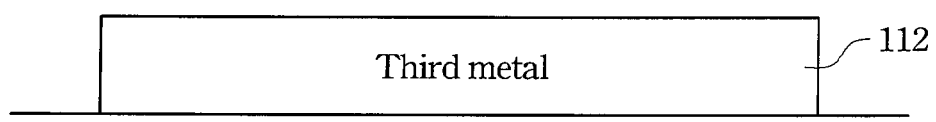
FIG. 1 is a structure diagram depicting a magnetic transistor of the prior art.
Figure 1:
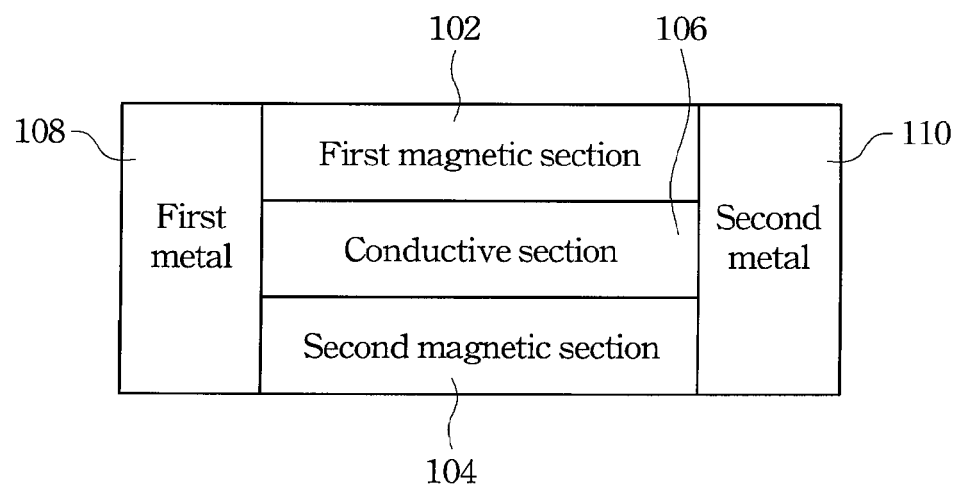
Figure 1:
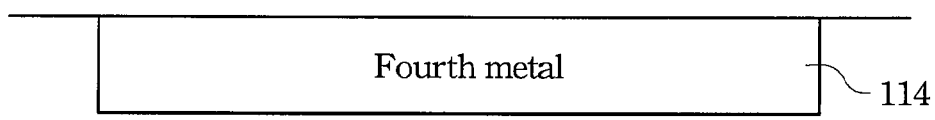

Reference will now be made in detail to the present preferred embodiments of the invention, examples of which are illustrated in the accompanying drawings. Wherever possible, the same reference numbers are used in the drawings and the description to refer to the same or like parts.

All figures are drawn for ease of explanation of the basic teachings of the present invention only; the extensions of the figures with respect to number, position, relationship, and dimensions of the parts to form the embodiment will be explained or will be within the skill of the art after the following description has been read and understood. Further, the exact dimensions and dimensional proportions to conform to specific force, weight, strength, and similar requirements will likewise be within the skill of the art after the following description has been read and understood.

Figure 2A:
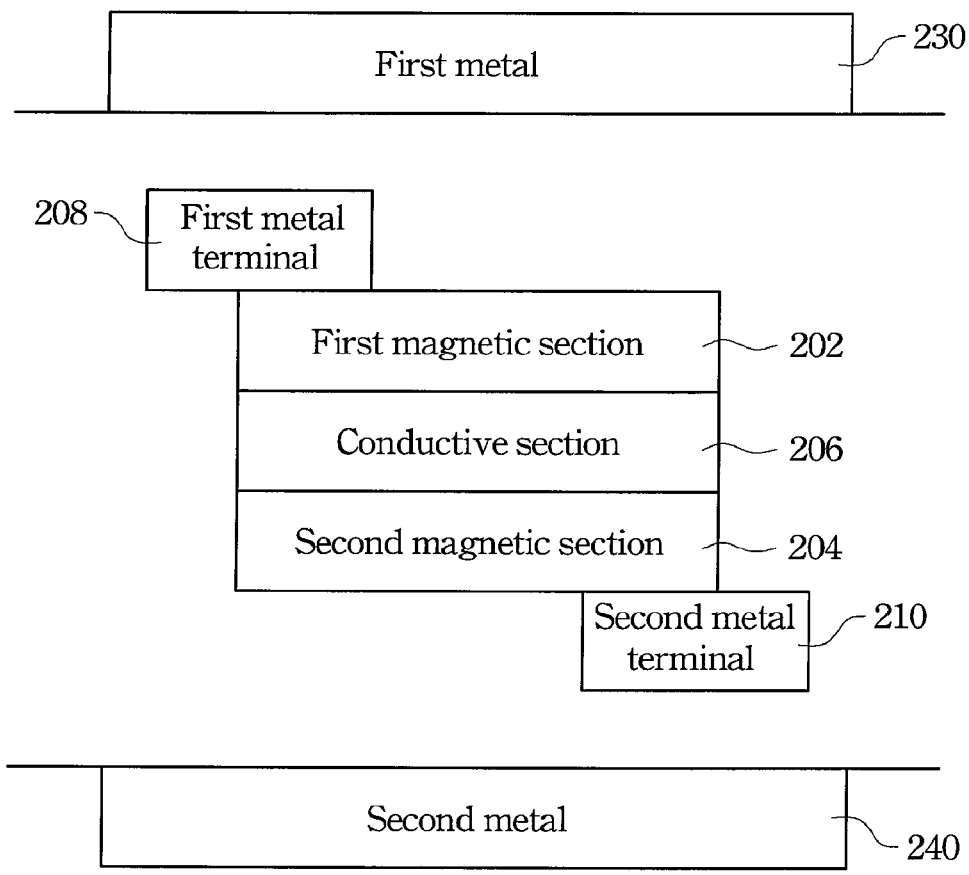
FIG. 2A is a structure diagram depicting a magnetic transistor according to one embodiment of this invention.

FIG. 2A is a structure diagram depicting a magnetic transistor 200 according to one embodiment of this invention. A magnetic transistor 200 includes a first magnetic section 202, a second magnetic section 204, a conductive section 206, a first metal terminal 208, and a second metal terminal 210. Those skilled in the art will recognize the first magnetic section 202, and the second magnetic section 204, for example, is made up from a multiple of the magnetic layers.

The conductive section 206 is disposed between and is in direct contact with the first magnetic section 202 and the second magnetic section 204. For example, the conductive section 206 is disposed on the second magnetic section 204, and the first magnetic section 202 is disposed on the conductive section 206. The first magnetic section 202, the conductive section 206, and the second magnetic section 204 are about the same length.

The first metal terminal 208 is disposed on one end of an opposite surface to the conductive section 206 of the first magnetic section 202. The second metal terminal 210 is disposed on one end approximately diagonal to the first metal terminal 208 on an opposite surface to the conductive section of the second magnetic section 210. For example, the first metal terminal 208 is disposed partially on one end of an opposite surface to the conductive section 206 of the first magnetic section 202, the second metal terminal 210 is disposed partially on one end approximately diagonal to the first metal terminal 208 on an opposite surface to the conductive section of the second magnetic section 210, the first metal terminal 208 is disposed on the left side of the first magnetic section 202 and the second metal terminal 210 is disposed on the right side of the second magnetic section 204.

Figure 2B:
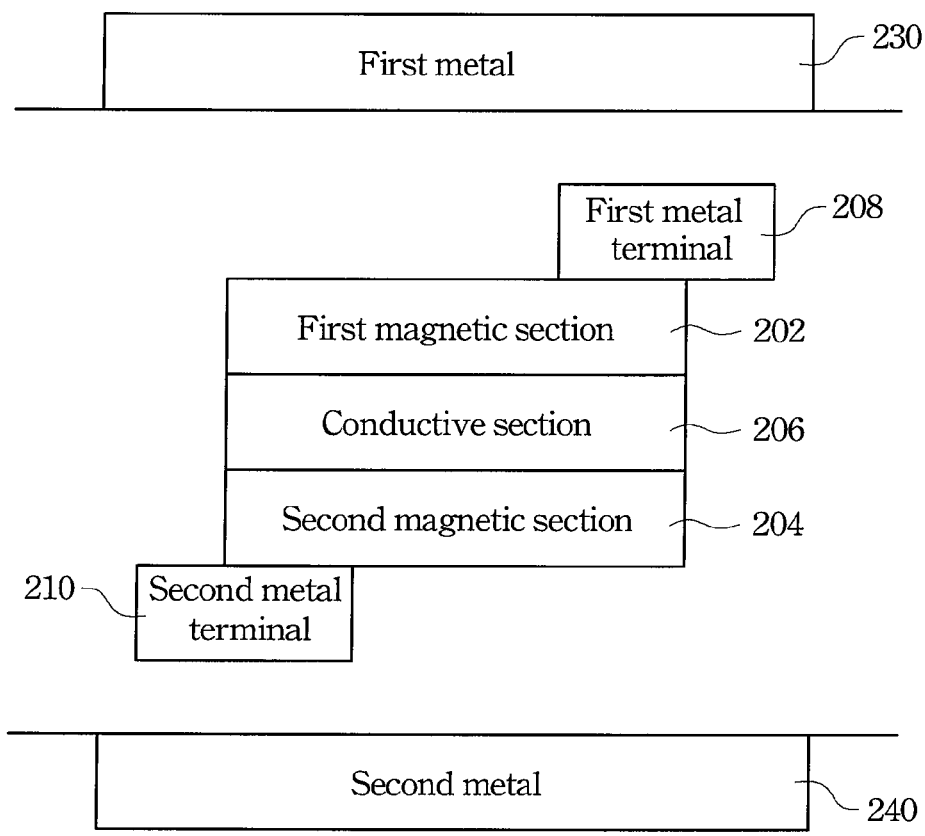
FIG. 2B is a structure diagram depicting a magnetic transistor according to another embodiment of this invention.

FIG. 2B is another embodiment depicting the disposal of the first metal terminal 208 and the second metal terminal 210 of a magnetic transistor structure 200. The first metal terminal 208 is disposed on the right side of the first magnetic section 202 and the second metal terminal 210 is disposed on the left side of the second magnetic section 204.

An operation of the magnetic transistor structure 200 is disclosed as follows. Those skilled in the art will be aware that the operation of the magnetic transistor, for example, is according to an external applied field (for example, using the first metal 230 and the second metal 240 to control the direction of the dipoles of the first magnetic section 202 and the second magnetic section 204). While the magnetic transistor structure 200 is turned on, a current is outputted from the first metal terminal 208 or the second metal terminal 210 by flowing through the first magnetic section 202 and the second magnetic section 204 via the conductive section 206. For example, the current flows in the direction of the first metal terminal 208 to the second metal terminal 210, or the current flows in the direction of the second metal terminal 210 to the first metal terminal 208.

The embodiments illustrate that disposing the first metal terminal 208 on one end of an opposite surface to the conductive section 206 of the first magnetic section 202, and disposing the second metal terminal 210 on one end approximately diagonal to the first metal terminal 208 on an opposite surface to the conductive section 206 of the second magnetic section 204, which results in the current flowing through the boundary between the first magnetic section 202 and the conductive section 206, and a boundary between the conductive section 206 and the second magnetic section 204. Hence the magnetic transistor structure 200 exhibits a higher resistance change rate.

Figure 3:
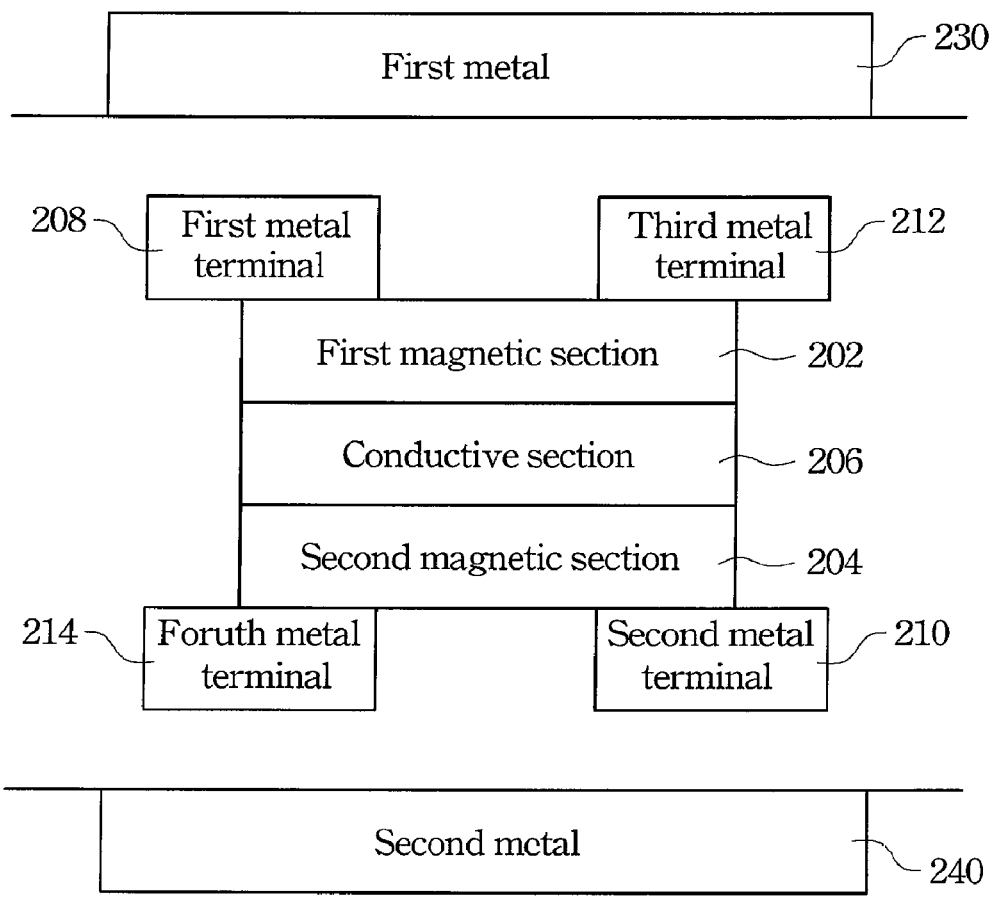
FIG. 3 is a structure diagram depicting a magnetic transistor according to another embodiment of this invention.

FIG. 3 is a structure diagram depicting a magnetic transistor 300 according to another embodiment of this invention. A magnetic transistor 300 includes a first magnetic section 202, a second magnetic section 204, a conductive section 206, a first metal terminal 208, a second metal terminal 210, a third metal terminal 212, and a fourth metal terminal 214.

The first metal terminal 208 is disposed on one end of an opposite surface to the conductive section 206 of the first magnetic section 202. The second metal terminal 210 is disposed on one end approximately diagonal to the first metal terminal 208 on an opposite surface to the conductive section 206 of the second magnetic section 204. The third metal terminal 212 is disposed on the other end of the opposite surface to the conductive section 206 of the first magnetic section 202. The fourth metal terminal 214 is disposed on the other end approximately diagonal to the third metal terminal 212 on the opposite surface to the conductive section 206 of the second magnetic section 214. For example, the first metal terminal 208 is disposed partially on one end of an opposite surface to the conductive section 206 of the first magnetic section 202. The second metal terminal 210 is disposed partially on one end approximately diagonal to the first metal terminal 208 on an opposite surface to the conductive section 206 of the second magnetic section 204. The third metal terminal 212 is disposed partially on the other end of the opposite surface to the conductive section 206 of the first magnetic section 202. The fourth metal terminal 214 is disposed partially on the other end approximately diagonal to the third metal terminal 212 on the opposite surface to the conductive section 206 of the second magnetic section 214.

In addition, a space exists between the first metal terminal 208 and the third metal terminal 212 disposed on the first magnetic section 202, and a space exists between the second metal terminal 210 and the fourth metal terminal 214 disposed on the second magnetic section 204.

An operation of the magnetic transistor 300 is disclosed as follows. While the magnetic transistor 300 is turned on, a current is outputted from either the first metal terminal 208, the second metal terminal 210, the third metal terminal 212, or the fourth metal terminal 214.

The embodiments illustrate that the first metal terminal 208 is disposed on one end of an opposite surface to the conductive section 206 of the first magnetic section 202, and the second metal terminal 210 is disposed on one end approximately diagonal to the first metal terminal 208 on an opposite surface to the conductive section 206 of the second magnetic section 204, which results in the current flowing through the first magnetic section 202 and the second magnetic section 204 via the conductive section 206 while the magnetic transistor 300 is turned on. The foregoing arrangement of the first metal terminal 208 and the second metal terminal 210 allows a current to flow from the second metal terminal 210 and is outputted from the first metal terminal 208, or a current flows from the first metal terminal 208 and is outtputed from the second metal terminal 210.

The third metal terminal 212 is disposed on the other end of the opposite surface to the conductive section 206 of the first magnetic section 202, and the fourth metal terminal 214 is disposed on the other end approximately diagonal to the third metal terminal 212 on the opposite surface to the conductive section 206 of the second magnetic section 204 which results in the current flowing through the first magnetic section 202 and the second magnetic section 204 via the conductive section 206 while the magnetic transistor 300 is turned on. The foregoing arrangement of the third metal terminal 212 and the fourth metal terminal 214 which allows a current to flow from the third metal terminal 212 and outtputed from the fourth metal terminal 214, or a current flows from the fourth metal terminal 214 and is outtputed from the third metal terminal 212.

Hence the magnetic transistor 300 exhibits a higher resistance change rate with a 4-terminal (a current either outputted from the first metal terminal 208, the second metal terminal 210, the third metal terminal 212, and the fourth metal terminal 214) outputted capability.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A magnetic transistor, comprising:
   a first magnetic section; a second magnetic section;
   a conductive section, disposed between and in direct contact with both the first and second magnetic section;
   a first metal terminal, disposed on one end of an opposite surface to the conductive section of the first magnetic section;
   a second metal terminal, disposed on one end approximately diagonal to the first metal terminal on an opposite surface to the conductive section of the second magnetic section; and
   a third metal terminal and a fourth metal terminal, wherein the third metal terminal is disposed on the other end of the opposite surface to the conductive section of the first magnetic section, and the fourth metal terminal is disposed on the other end approximately diagonal to the third metal terminal on the opposite surface to the conductive section of the second magnetic section;
   wherein while the magnetic transistor structure is turned on, a current flows through the first magnetic section and the second magnetic section via the conductive section.

2. The magnetic transistor of claim 1, wherein the first magnetic section, the conductive section, and the second magnetic section are about the same length.

3. The magnetic transistor of claim 1, wherein the first metal terminal is disposed on the right side of the first magnetic section, and the second metal terminal is disposed on the left side of the second magnetic section.

4. The magnetic transistor of claim 3, wherein the current flows from the second metal terminal and is outputted from the first metal terminal while the magnetic transistor structure is turned on.

5. The magnetic transistor of claim 3, wherein the current flows from the first metal terminal and is outputted from the second metal terminal while the magnetic transistor structure is turned on.

6. The magnetic transistor of claim 1, wherein the first metal terminal is disposed on the left side of the first magnetic section, and the second metal terminal is disposed on the right side of the second magnetic section.

7. The magnetic transistor of claim 6, wherein the current flows from the second metal terminal and is outputted from the first metal terminal while the magnetic transistor structure is turned on.

8. The magnetic transistor of claim 6, wherein the current flows from the first metal terminal and is outputted from the second metal terminal while the magnetic transistor structure is turned on.

9. The magnetic transistor of claim 1, wherein a space exists between the first metal terminal and the third metal terminal disposed on the first magnetic section, and a space exists between the second metal terminal and the fourth metal terminal disposed on the second magnetic section.

10. The magnetic transistor of claim 1, wherein the current flows from the fourth metal terminal and is outputted from the third metal terminal while the magnetic transistor structure is turned on.

11. The magnetic transistor of claim 10, wherein the current flows from the third metal terminal and is outputted from the fourth metal terminal while the magnetic transistor structure is turned on.

12. A magnetic transistor, comprising:
    a first magnetic section;
    a second magnetic section;
    a conductive section, disposed between and in direct contact with both the first and second magnetic section, wherein the first magnetic section, the conductive section, and the second magnetic section are about the same length;
    a first metal terminal, disposed on one end of an opposite surface to the conductive section of the first magnetic section;
    a second metal terminal, disposed on one end approximately diagonal to the first metal terminal on an opposite surface to the conductive section of the second magnetic section;
    a third metal terminal, disposed on the other end of the opposite surface to the conductive section of the first magnetic section; and
    a fourth metal terminal, disposed on the other end approximately diagonal to the third metal terminal on the opposite surface to the conductive section of the second magnetic section,
    wherein a current is outputted from either the first metal terminal, the second metal terminal, the third metal terminal or the fourth metal terminal by flowing through the first magnetic section and the second magnetic section via the conductive section while the magnetic transistor is turned on.

13. The magnetic transistor of claim 12, wherein a space exists between the first metal terminal and the third metal terminal disposed on the first magnetic section, and a space exists between the fourth metal terminal and the second metal terminal disposed on the second magnetic section.

14. The magnetic transistor of claim 12, wherein the current flows from the second metal terminal and is outputted from the first metal terminal while the magnetic transistor structure is turned on.

15. The magnetic transistor of claim 12, wherein the current flows from the first metal terminal and is outputted from the second metal terminal while the magnetic transistor structure is turned on.

16. The magnetic transistor of claim 12, wherein the current flows from the fourth metal terminal and is outputted from the third metal terminal while the magnetic transistor structure is turned on.

17. The magnetic transistor of claim 12, wherein the current flows from the third metal terminal and is outputted from the fourth metal terminal while the magnetic transistor structure is turned on.

* * * * *